United States Patent
Biber et al.

(10) Patent No.: US 8,085,048 B2
(45) Date of Patent: Dec. 27, 2011

(54) ARRANGEMENT TO DETUNE A RECEPTION ANTENNA IN A LOCAL COIL

(75) Inventors: Stephan Biber, Erlangen/Frauenaurach (DE); Helmut Greim, Adelsdorf (DE); Joerg Christopher Stapf, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 313 days.

(21) Appl. No.: 12/404,793

(22) Filed: Mar. 16, 2009

(65) Prior Publication Data

US 2009/0237081 A1 Sep. 24, 2009

(30) Foreign Application Priority Data

Mar. 18, 2008 (DE) .......................... 10 2008 014 751

(51) Int. Cl.
*G01V 3/00* (2006.01)
(52) U.S. Cl. .......................... 324/318; 324/322; 324/307
(58) Field of Classification Search .......... 324/300–322; 600/407–435; 382/128–131
See application file for complete search history.

(56) References Cited

U.S. PATENT DOCUMENTS

| | | | | |
|---|---|---|---|---|
| 5,666,055 A * | 9/1997 | Jones et al. | ................... | 324/318 |
| 5,903,151 A * | 5/1999 | Potthast | ........................ | 324/318 |
| 6,710,597 B2 | 3/2004 | Reykowski et al. | .......... | 324/318 |
| 7,417,433 B2 | 8/2008 | Heid et al. | ..................... | 324/318 |
| 7,443,165 B2 * | 10/2008 | Varjo | ............................ | 324/322 |
| 7,602,187 B2 * | 10/2009 | Luedeke et al. | .............. | 324/318 |
| 2004/0124838 A1 * | 7/2004 | Duerk et al. | ................... | 324/304 |
| 2007/0167726 A1 * | 7/2007 | Unal et al. | ..................... | 600/410 |
| 2007/0182409 A1 * | 8/2007 | Varjo | ............................ | 324/304 |
| 2007/0268018 A1 | 11/2007 | Wendt et al. | ................... | 324/301 |
| 2008/0114235 A1 * | 5/2008 | Unal et al. | ..................... | 600/411 |
| 2008/0183070 A1 * | 7/2008 | Unal et al. | ..................... | 600/414 |
| 2008/0208031 A1 * | 8/2008 | Kurpad et al. | .................. | 600/410 |
| 2008/0272786 A1 * | 11/2008 | Luedeke et al. | .............. | 324/322 |
| 2009/0237081 A1 * | 9/2009 | Biber et al. | ..................... | 324/322 |
| 2009/0278537 A1 * | 11/2009 | Harvey | ......................... | 324/309 |
| 2010/0188208 A1 * | 7/2010 | Fisher et al. | ............. | 340/539.12 |
| 2010/0256481 A1 * | 10/2010 | Mareci et al. | ................. | 600/423 |
| 2010/0277175 A1 * | 11/2010 | Weiss | ............................. | 324/318 |
| 2010/0294829 A1 * | 11/2010 | Giordano et al. | .......... | 227/176.1 |
| 2010/0301862 A1 * | 12/2010 | Tropp et al. | ................... | 324/318 |
| 2011/0218402 A1 * | 9/2011 | Sato et al. | ..................... | 600/160 |

* cited by examiner

*Primary Examiner* — Melissa Koval
*Assistant Examiner* — Tiffany Fetzner
(74) *Attorney, Agent, or Firm* — Schiff Hardin LLP

(57) ABSTRACT

An arrangement to detune a reception antenna in a local coil of a magnetic resonance system, with at least one reception antenna that is fashioned as a loop antenna and that has at least one first capacitance. Radio-frequency signals of a magnetic resonance examination are received via the reception antenna. A switchable detuning circuit contains the first capacitance connected to an oscillating circuit and a first inductance. A reception device to receive a control signal is coupled with the oscillating circuit. The reception device switches the oscillating circuit into a high-resistance state given a received control signal so that a receipt of a radio-frequency signal via the reception antenna is prevented. The reception device is fashioned to receive a wirelessly transmitted radio-frequency control signal. The radio-frequency control signal has a frequency that lies outside of the bandwidth of the radio-frequency signal used for magnetic resonance examination.

9 Claims, 2 Drawing Sheets

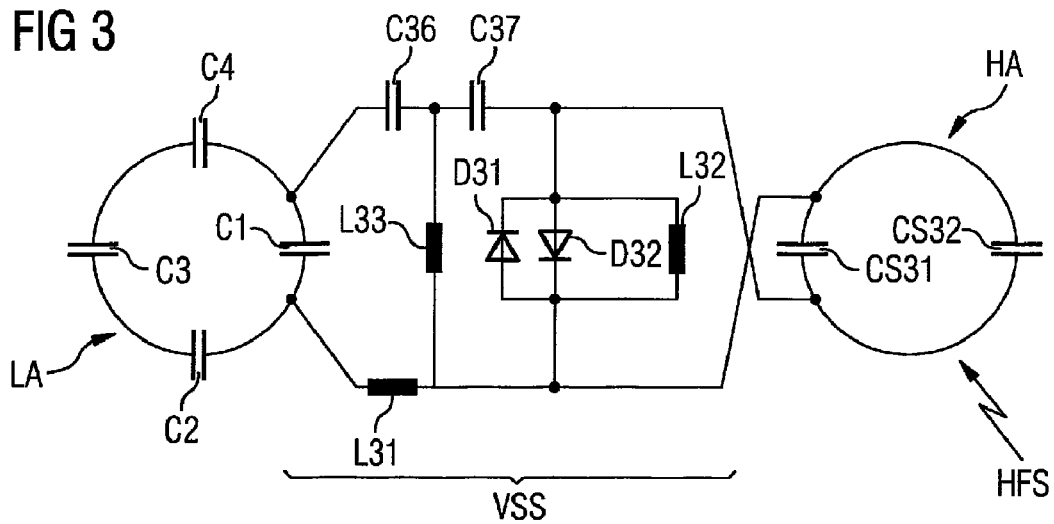
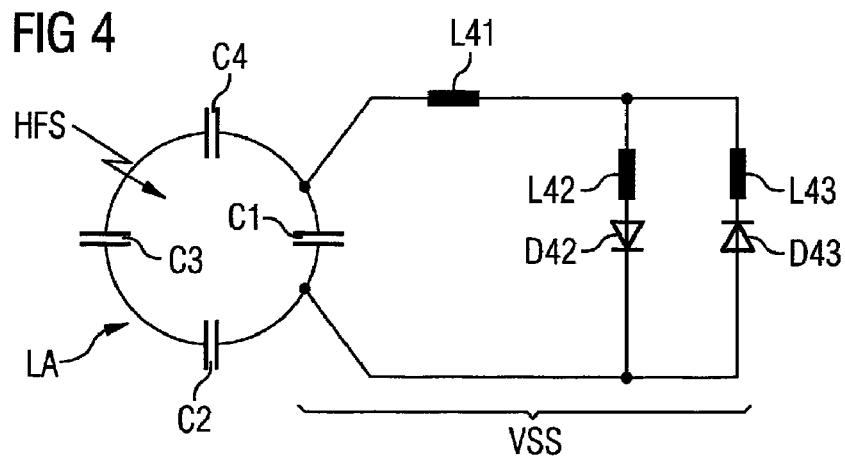
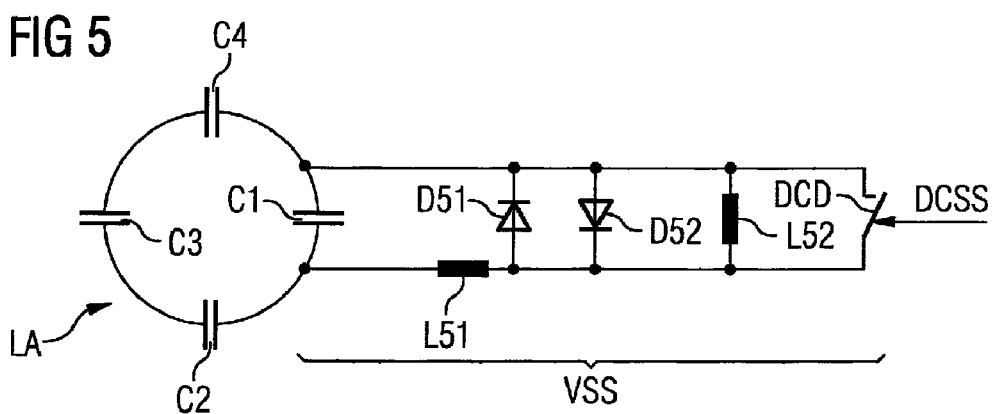

ARRANGEMENT TO DETUNE A RECEPTION ANTENNA IN A LOCAL COIL

BACKGROUND OF THE INVENTION

1. Field of the Invention

The present invention concerns an arrangement to detune a reception antenna in a local coil of the type employing a switchable tuning circuit.

2. Description of the Prior Art

In modern magnetic resonance systems, magnetic resonance examination signals are acquired with the use of local coils placed close to the patient.

In addition to actual reception antennas (that are preferably fashioned as loop antennas), the local coil contains additional low-noise preamplifiers in order to be able to amplify the acquired magnetic resonance signals. The local coil additionally contains for each loop antenna, an associated active detuning circuit with which that reception antenna can be detuned during a transmission phase.

During the transmission phase the detuning is necessary in order to prevent an unwanted inductive injection of strong currents (which could be generated in the reception antenna by a received transmission signal) into the patient body. The unwanted reception of the transmission signal in the reception antenna is thus prevented with the use of the detuning circuit.

FIG. 5 shows an arrangement to detune a reception antenna LA of a local coil that is designed as a loop antenna.

The reception antenna LA shows four capacitances C1 through C4 that are fashioned to shorten the reception antenna LA.

A first capacitor C1 together with a first inductance L51 forms a block circuit that, together with a first diode D51, a second diode D52 and a second inductance L52 forms a detuning circuit VSS.

The first diode D51, the second diode D52 and the second inductor L52 are thereby connected in parallel with one another, and the two diodes D51, D52 are connected with opposite polarity relative to one another.

This parallel circuit is connected at the input side with a first end of the first capacitor C1 while the parallel circuit is connected at the output side via the first inductance L51 with a second end of the first capacitor C1.

As described, during the transmission phase it is necessary to detune the reception antenna LA. For this purpose a controllable switch DCD is provided that is connected parallel to the two diodes D51, D52.

The switch DCD is preferably designed as a DC diode and is switched with the aid of a direct current signal DCSS as a control signal. The direct current signal DCSS as a control signal is directed via cables to the switch DCD.

Given a closed switch DCD, the first inductance L51 together with the first capacitance C1 forms a high-resistance block circuit, such that the detuning circuit VSS "detunes" and the loop-shaped reception antenna LA is therefore quasi-interrupted. In this case no reception of magnetic resonance signals is possible via the reception antenna LA.

If the first capacitance C1 has a residual charge, or that the reception antenna LA nevertheless receives during the transmission phase (for example because the control signal DCSS is not present due to a line disconnection), either the first diode D51 or the second diode D52 (depending on polarity of the capacitance C1) is switched through, such that the first inductance L51 together with the first capacitance C1 forms a high-resistance block circuit. The detuning circuit VSS is therefore also "detuned" for these cases.

The second inductance L52 serves to discharge residual voltages of the two diodes D51 and D52. This type of detuning is designated as "active detuning".

Given such local coils the respective preamplifier and the respective detuning circuits are supplied via cables with operating voltage and operating power.

The received magnetic resonance signals are also forwarded on via cables for additional processing.

The DC control signals described above for the active detuning circuit are transferred via cables.

Due to this multiplicity of necessary cables, a cable bundle connected with the local coil is formed that is unwieldy and can be difficult to manage.

Due to the dimensions and the resulting weight, as well as the movement of the cable bundle, mechanical defects can occur at the respective plugs and at the individual cables.

Concepts are presently being developed that enable a wireless transmission of the received magnetic resonance signals from the local coil for additional processing.

The received magnetic resonance signals are thereby amplified only after a successful wireless transmission, such that the preamplifiers are no longer an integrated part of the local coil.

The mechanically susceptible cable connections that are required for the feed of the control signals for the active detuning circuit still remain.

SUMMARY OF THE INVENTION

An object of the present invention to provide, for a local coil whose received magnetic resonance signals are transmitted wirelessly for additional processing, an arrangement for detuning that is less error-prone with less expenditure.

This object is achieved by an arrangement according to the invention for detuning a reception antenna in a local coil having at least one reception antenna that is fashioned as a loop antenna and that ahs at least one first capacitance. Radio-frequency signals of a magnetic resonance examination are received by the reception antenna. A switchable detuning circuit contains the first capacitance a first inductance connected to an oscillating circuit. A reception device to receive a control signal is coupled with the oscillating circuit, and the reception device switches the oscillating circuit into a high-resistance state when a control signal is received. A receipt of a radio-frequency signal via the reception antenna is therefore prevented.

The reception device is fashioned to receive a wirelessly transmitted radio-frequency control signal. The radio-frequency control signal has a frequency that lies outside of the bandwidth of the radio-frequency signal used for magnetic resonance examination.

An active detuning that is activated or deactivated with the use of an additional wirelessly transmitted control signal as an auxiliary signal is achieved by the arrangement according to the invention.

The active detuning foregoes a wired feed of control signals so that the previously necessary connection cables for control signal transmission are spared.

The activation or deactivation of the detuning circuit no longer ensues via cables and is therefore less error-prone.

DESCRIPTION OF THE DRAWINGS

FIG. 3 shows a third embodiment of the arrangement according to the invention.

FIG. 4 shows a fourth embodiment of the arrangement according to the invention.

FIG. 5 shows the arrangement described above for detuning a reception antenna of a local coil according to the prior art.

DESCRIPTION OF THE PREFERRED EMBODIMENTS

Figure 1:
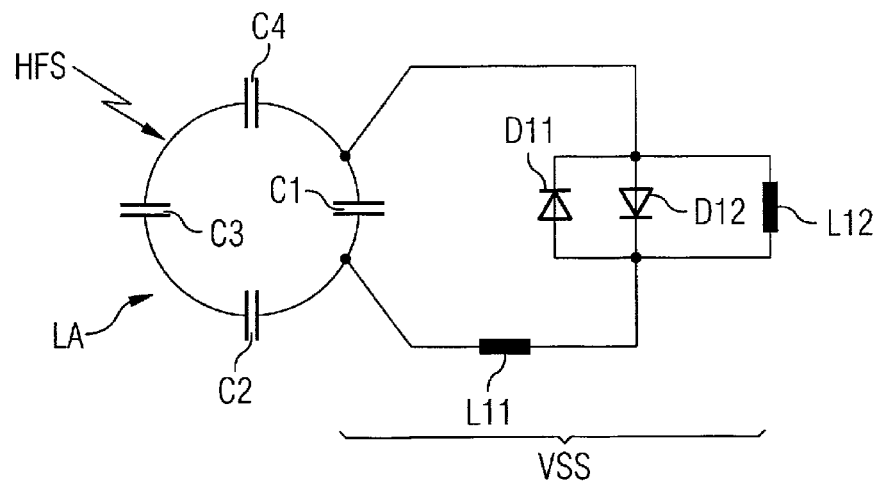
FIG. 1 shows a first embodiment of the arrangement according to the invention.

FIG. 1 shows a first embodiment of the arrangement according to the invention with what is known as a loop antenna LA as a reception antenna.

The reception antenna LA shows four capacitances C1 through C4 that are fashioned to shorten the reception antenna LA.

A first capacitor C1 together with a first inductance L11 forms a block circuit that, together with a first diode D11, a second diode D12 and a second inductance L12, forms a detuning circuit VSS.

The first diode D11, the second diode D12 as well as the second inductance L12 are connected in parallel to one another, wherein the two diodes D11, D12 are additionally connected or, respectively, arranged inverse to one another.

This parallel circuit is connected on the input side with a first end of the first capacitor C1 while the parallel circuit is connected at the output side via the first inductance L11 with a second end of the first capacitor C1.

In a patient examination, magnetic resonance signals with a bandwidth BMR are received via the reception antenna LA.

These received magnetic resonance signals are induced by a transmission signal that is radiated towards the patient during a transmission phase via a transmission antenna (not shown here).

As described above, it is necessary to detune the reception antenna LA during the transmission phase.

For this purpose, not only the transmission signal but also an additional auxiliary signal HFS as a control signal are transferred during the transmission phase. The auxiliary signal HFS has a frequency $f_{HFS}$ that is located just outside the bandwidth $B_{MR}$ of the transmission signal used for examination.

In the embodiment shown here, the auxiliary signal HFS is received via the reception antenna LA. Either the first diode D11 or the second diode D12 is switched through by the auxiliary signal HFS, such that the first inductance L11 together with the first capacitance C1 forms a high-resistance block circuit. The detuning circuit VSS is therefore detuned.

The second inductance L12 serves to discharge residual voltages of the two diodes D11 and D12.

Figure 2:
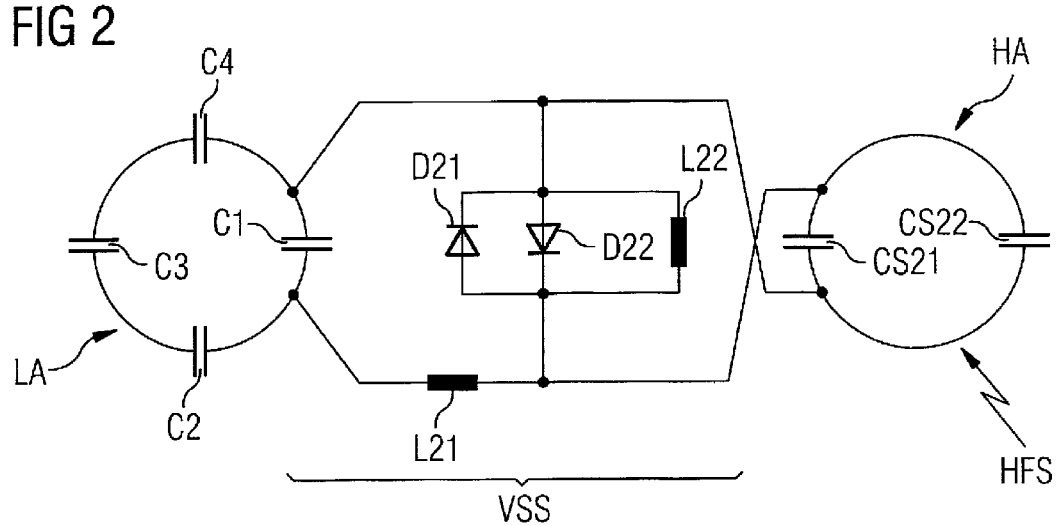
FIG. 2 shows a second embodiment of the arrangement according to the invention.

FIG. 2 shows a second embodiment of the arrangement according to the invention, with a loop antenna LA as a reception antenna.

The reception antenna LA shows four capacitances C1 through C4 that are fashioned to shorten the reception antenna LA.

A first capacitor C1 together with a first inductance L21 forms a block circuit that, together with a first diode D21, a second diode D22 and a second inductance L22, forms a detuning circuit VSS.

The first diode D21, the second diode D22 as well as the second inductance L22 are thereby connected in parallel to one another, wherein the two diodes D21, D22 are additionally connected or, respectively, arranged inverse to one another.

This parallel circuit is connected on the input side with a first end of the first capacitor C1 while the parallel circuit is connected at the output side via the first inductance L21 with a second end of the first capacitor C1.

In a patient examination, magnetic resonance signals with a bandwidth BMR are received via the reception antenna LA.

These received magnetic resonance signals are induced by a transmission signal that is radiated towards the patient during a transmission phase by a transmission antenna (not shown).

As described above, it is necessary to detune the reception antenna LA during the transmission phase.

For this purpose not only the transmission signal but also an additional auxiliary signal HFS as a control signal are transferred during the transmission phase. The auxiliary signal HFS has a frequency $f_{HFS}$ that is located just outside the bandwidth BMR of the transmission signal used for examination.

In the embodiment shown here, the auxiliary signal HFS is received via an auxiliary antenna HA.

The auxiliary antenna HA here is exemplarily designed as a loop antenna and contains a first capacitance CS21 and a second capacitance CS22 for antenna shortening.

The auxiliary antenna HA is wired for coupling or connection with the detuning circuit VSS such that the first terminal of the first capacitance C1 is connected with a second terminal of the capacitance CS21 while the second terminal of the first capacitance C1 is connected via the inductance L21 with a first terminal of the capacitance CS21.

Either the first diode D21 or the second diode D22 is switched through by the auxiliary signal HFS, such that the first inductance L21 together with the first capacitance C1 forms a high-resistance block circuit. The detuning circuit VSS is therefore detuned.

The second inductance L22 serves to discharge residual voltages of the two diodes D21 and D22.

The advantage of this auxiliary antenna embodiment lies in that the actual reception antenna LA does not have to be modified with regard to its radio reception properties because the auxiliary signal reception is carried out independently via the auxiliary antenna HA.

FIG. 3 shows a variant (relative to FIG. 2) of the arrangement according to the invention as a third embodiment of the invention.

Corresponding to FIG. 2, a first capacitor C1 of the reception antenna LA forms a detuning circuit VSS together with a first inductance L31, a first diode D31, a second diode D32 and a second inductance L32.

The first diode D31, the second diode D32 as well as second inductance L32 are thereby connected in parallel to one another, wherein the two diodes D31, D32 are additionally connected or, respectively, arranged inverse to one another.

This parallel circuit is connected on the input side via a λ/4 phase shifter with a first end of the first capacitor C1, while the parallel circuit is connected at the output side via the λ/4 phase shifter and via the first inductance L31 with a second end of the first capacitor C1.

The λ/4 phase shifter contains two capacitances C36 and C37 in a shunt arm in the form of a T-circuit as well as an inductance L33 in a series arm.

The first end of the capacitance C1 is connected via the two capacitances C36 and C37 with the input of the parallel circuit.

The first end of the capacitance C1 is connected via the capacitance C36, the inductance L33 and the first inductance L31 with the second end of the capacitance C1.

The second end of the capacitance C1 is connected via the first inductance L31 with the output of the parallel circuit.

In the embodiment shown here, the auxiliary signal HFS used as a control signal is received via an auxiliary antenna HA.

The auxiliary antenna HA here is exemplarily designed as a loop antenna and contains a first capacitance CS31 and a second capacitance CS32 for antenna shortening.

The auxiliary antenna HA is wired for coupling or, respectively, connection with the detuning circuit VSS such that the first terminal of the first capacitance C1 is connected via the two capacitances C36 and C37 with a second terminal of the capacitance CS31 while the second terminal of the first capacitance C1 is connected via the inductance L31 with a first terminal of the capacitance CS31.

The second inductance L32 serves to discharge residual voltages of the two diodes D31 and D32.

The mode of operation of the arrangement presented here differs with regard to the function described in FIG. 2.

If an auxiliary signal HFS is absent, the two diodes D31 and D32 are not switched through and thus form a radio-frequency open circuit at the λ/4 transformer. This open circuit is transformed via the λ/4 transformer into a radio-frequency short in the direction of the reception antenna LA so that the detuning circuit VSS is detuned via the capacitance C1 and via the inductance L31. The capacitance C1 and the inductance L31 form a high-resistance block circuit.

If, in contrast to this, the auxiliary signal HFS is transferred and received via the auxiliary antenna HA, either the diode D31 or the diode D32 is switched through so that a radio-frequency short is formed at the λ/4 transformer. This short is transformed via the lamdat/4 transformer into a radio-frequency open circuit in the direction of the reception antenna LA so that the detuning circuit VSS is tuned. The capacitance C1 is decoupled from the inductance L31; the block circuit cannot act via the open circuit.

In summary, the detuning circuit VSS here is basically detuned. The detuning circuit VSS is essentially deactivated only given the transmission of the auxiliary signal HFS, such that the reception antenna LA is ready for operation.

The auxiliary signal HFS is correspondingly not transmitted during the transmission phase but rather during the duration of a desired acquisition phase.

FIG. 4 shows a fourth embodiment of the arrangement according to the invention, with a loop antenna LA as a reception antenna.

The reception antenna LA shows four capacitances C1 through C4 that are fashioned to shorten the reception antenna LA.

A first capacitor C1 together with a first inductance L41, a first diode D42, a second diode D43, a second inductance L42 and a third inductance L43, forms a detuning circuit VSS.

The first diode D42 is a PIN diode while the second diode D43 is designed as a rectifier diode.

The first diode D42 and the second inductance L42 are connected in series. The second diode D43 and the third inductance L43 are connected in series.

Both series circuits are in turn connected in parallel with one another, wherein the two diodes D42, D43 are additionally connected or, respectively, arranged inverse to one another.

The parallel circuit is connected on the input side via the first inductance L41 with a first end of the first capacitor C1, while the parallel circuit is connected at the output side with a second end of the first capacitor C1.

In a patient examination, magnetic resonance signals with a bandwidth BMR are received via the reception antenna LA. These received magnetic resonance signals are induced by a transmission signal that is radiated towards the patient via a transmission antenna (not shown here) during a transmission phase.

As described above, during the transmission phase it is necessary to detune the reception antenna LA.

For this purpose not only the transmission signal but also an additional auxiliary signal HFS as a control signal are transferred during the transmission phase. The auxiliary signal HFS has a frequency $f_{HFS}$ that is located just outside the bandwidth BMR of the transmission signal used for examination.

In the embodiment shown here, the auxiliary signal HFS is received via the reception antenna LA. Either the first diode D42 or the second diode D43 is switched through by the auxiliary signal HFS, such that the first inductance L41 together with the first capacitance C1 forms a high-resistance block circuit. The detuning circuit VSS is therefore detuned.

The parallel connection described above of the first series circuit with the elements L42 and D42 and the second series circuit with the elements L43 and D43 can seamlessly replace the parallel connection of the elements D11, D12 and L12 described in FIG. 1.

The same applies for the parallel connections of the elements D21, D22 and L22 from FIG. 2 and the elements D31, D32 and L32 from FIG. 3.

The described embodiments in particular have the advantage that a control signal HFS received with a low amplitude causes a switching of the oscillating circuit.

Although modifications and changes may be suggested by those skilled in the art, it is the intention of the inventors to embody within the patent warranted hereon all changes and modifications as reasonably and properly come within the scope of their contribution to the art.

We claim as our invention:

1. An arrangement that detunes a reception antenna in a local coil of a magnetic resonance system comprising:
   at least one reception antenna configured as a loop antenna and having at least one first capacitance said loop antenna being configured to receive radio-frequency signals of a magnetic resonance examination;
   a switchable detuning circuit that contains the first capacitance connected to an oscillating circuit and a first inductance;
   a reception device configured to receive a wirelessly transmitted radio-frequency control signal that has a separate radio-frequency outside of the bandwidth of the radio frequency signal used for magnetic resonance examination: and
   said reception device being configured to switch the oscillating circuit into a high-resistance state upon receipt of said wirelessly transmitted radio-frequency control signal, and said oscillating circuit in said high resistance state being configured to prevent reception of a radio-frequency signal by the reception antenna.

2. An arrangement as claimed in claim 1, wherein the reception antenna is configured as said reception device for the wirelessly transmitted radio-frequency control signal.

3. An arrangement as claimed in claim 1, wherein the reception devices configured as an exhilarating antenna that is coupled with the oscillating circuit so that the oscillating circuit is switched into a high-resistance state upon receipt of the wirelessly transmitted radio-frequency control signal.

4. An arrangement as claimed in claim 1, wherein the oscillating circuit has a first diode, a second diode and a second inductance;

the first diode, the second diode and the second inductance are connected in parallel with one another;

the two diodes are connected with opposite polarity; and the parallel circuit is connected at an input side thereof with a first end of the first capacitor and is connected at an output side thereof through the first inductance to a second end of the first capacitor.

5. An arrangement as claimed in claim 3, wherein the auxiliary antenna is configured as a loop antenna and has at least one first capacitance;

a first terminal of the first capacitance of the oscillating circuit is connected with a second terminal of the first capacitance of the auxiliary antenna; and a second terminal of the first capacitance of the oscillating circuit is connected through the first inductance of the oscillating circuit with a first terminal of the first capacitance of the auxiliary antenna.

6. An arrangement as claimed in claim 5, wherein the parallel circuit is connected at an input side thereof via a λ/4 phase shifter with a first end of the first capacitor of the oscillating circuit; and the parallel circuit is connected at an output side thereof via the λ/4 phase shifter and via the first inductance with a second end of the first capacitor of the oscillating circuit.

7. An arrangement as claimed in claim 6, wherein the λ/4 phase shifter is a T-circuit having two capacitances in a shunt arm as well as an inductance in a series arm;

the first end of the first capacitance of the oscillating circuit is connected via the two capacitances with the input of the parallel circuit; and the first end of the first capacitance of the oscillating circuit is connected via one of the capacitances of the phase shifter, via the inductance of the phase shifter, and via the first inductance of the oscillating circuit, with the second end of the first capacitance of the oscillating circuit.

8. An arrangement as claimed in claim 1, wherein:

the oscillating circuit comprises a first diode, a second diode, a second inductance and a third inductance;

the first diode is a PIN diode and the second diode is a rectifier diode;

the first diode and the second inductance are connected in series;

the second diode and the third inductance are connected in series;

said series circuits being connected in parallel with one another;

the two diodes are connected with opposite polarity relative to one another;

the series circuits connected in parallel are connected at an input side via the first inductance of the oscillating circuit with a first end of the first capacitor of the oscillating circuit; and the series circuits connected in parallel are connected at an output side with a second end of the first capacitor of the oscillating circuit.

9. An arrangement as claimed in claim 1, wherein the local coil contains a transmission device that is fashioned for wireless transmission, to an additional processing device, of unamplified magnetic resonance signals that are acquired during a reception phase via the reception antenna.

* * * * *